United States Patent [19]

Bengston et al.

[11] Patent Number: 5,235,139
[45] Date of Patent: Aug. 10, 1993

[54] METHOD FOR FABRICATING PRINTED CIRCUITS

[75] Inventors: Jon E. Bengston, Newington; Gary B. Larson, Cheshire, both of Conn.

[73] Assignee: MacDermid, Incorprated, Waterbury, Conn.

[21] Appl. No.: 581,030

[22] Filed: Sep. 12, 1990

[51] Int. Cl.⁵ .............................. H05K 1/00
[52] U.S. Cl. ............................ 174/257; 174/260; 361/808; 29/877
[58] Field of Search ............ 174/256, 257, 260, 262, 174/264, 266, 263; 361/397, 418; 427/98, 443.1, 97, 96, 99; 428/34.6; 29/877; 228/180.1

[56] References Cited

U.S. PATENT DOCUMENTS

| | | | |
|---|---|---|---|
| 4,002,778 | 1/1977 | Bellis et al. | 427/98 |
| 4,075,416 | 2/1978 | Küttner et al. | 361/397 X |
| 4,303,798 | 12/1981 | Paunovic | 427/98 X |
| 4,482,596 | 11/1984 | Gulla et al. | 427/443.1 X |
| 4,597,177 | 7/1986 | Baldauf et al. | 174/257 X |
| 4,632,857 | 12/1986 | Mallory, Jr. | 427/98 X |
| 4,940,181 | 7/1990 | Juskey, Jr. et al. | 174/263 X |
| 4,941,582 | 7/1990 | Morikawa et al. | 428/34.6 X |
| 4,950,623 | 8/1990 | Dishon | 29/877 X |

*Primary Examiner*—Leo P. Picard
*Assistant Examiner*—Trinidad Korka
*Attorney, Agent, or Firm*—St. Onge Steward Johnston & Reens

[57] ABSTRACT

Conductive copper areas of printed circuits, such as through-holes, pads and lands, to which electronic components can thereafter be electrically connected by, e.g., wave soldering, are provided with a coating of nickel or cobalt, such as by electroless deposition from nickel-or cobalt-boron and nickel-or cobalt-phosphorous plating baths, or entirely or partly electrolytically, followed by a coating of a protective material which protects the nickel or cobalt coating from oxidation prior to the subsequent solder connection operation, is wettable by solder in the subsequent solder connection operation, and substantially dissolves in the solder in the subsequent solder connection operation without adverse effect on the solder joint between the electronic component and the through-hole, pad or land. A particular preferred protective material is gold, such as applied by deposition from immersion or electroless gold plating baths. The invention renders the so-treated areas readily susceptible to the soldering of components thereat, thereby avoiding the need for hot air solder levelling.

12 Claims, 2 Drawing Sheets

METHOD FOR FABRICATING PRINTED CIRCUITS

BACKGROUND OF THE INVENTION

The present invention relates to the fabrication of printed circuits, and more particularly to the provision in printed circuits of selected readily-solderable surfaces (e.g., on pads, through-holes and lands) for facilitating the subsequent connection thereat, by soldering, of electronic components.

In the manufacture of electronic equipment utilizing printed circuits, connections of electrical components to the printed circuit are made, e.g., by soldering of the leads of the components to the through-holes and surrounding pads provided on the printed circuit and/or by soldering of electronic components directly to surface areas ("lands") provided on the printed circuit (for so-called surface-mounted devices or SMD's), typically by wave soldering techniques.

To facilitate this soldering operation, the printed circuit fabricator is required to arrange that the through-holes, pads and lands are receptive to the solder connection process, i.e., possess surfaces which are wettable by the solder and which will permit an integral conductive connection, via the solder, with the leads or surfaces of the electronic components.

The primary means for arranging this good solderability of the surfaces in question is for the printed circuit fabricator to provide these surfaces with a solder coating, keeping in mind that at the same time other surfaces of the printed circuit (e.g., conductive traces) are generally to be masked by the fabricator so that, in the subsequent wave soldering of components to the printed circuit, these surfaces will not adherently receive solder. Provision of solder on these throughhole, pad or land surfaces is relatively straightforward because, in a typical printed circuit fabrication process, a tin-lead layer will in any event be selectively electroplated onto all exposed copper circuitry areas, including traces, pads, through-holes and lands, to serve as an etch-resist in the subsequent steps wherein copper is etched away at the selected non-circuitry areas of the printed circuit. Thereafter, a solder mask can be selectively applied to areas other than the holes, pads and lands, and the electroplated tin-lead can then be reflowed and fused to form the requisite solder alloy on these connection areas.

For a variety of reasons, the foregoing process is not ideal. In particular, the reflow of the tin-lead to form solder at the desired exposed holes, pads and lands, and the subsequent wave soldering operations, also cause the tin-lead under the solder mask at trace areas to become molten. The solder mask literally floats on the molten tin-lead layer, and wicking of the tin-lead up beneath the mask can result in formation of undesirable solder bridges between traces and proximate conductive areas on the circuit.

One means for avoiding these problems is the so-called "solder mask over bare copper" (SMOBC) technique, wherein there is no tin-lead on the copper traces which are covered by the solder mask. This technique eliminates the problems of wicking and solder bridging, but is generally expensive due to added processing steps. Thus, in the earlier-described typical fabrication process, the selectively plated tin-lead used as an etch resist must thereafter be stripped from the underlying copper areas, solder mask then applied over the areas (including now bare copper traces) other than pads, holes and lands, and then solder applied over the unmasked copper pads, holes and lands. Certain SMOBC techniques are known which avoid the need for tin-lead stripping, but these also involve additional processing steps.

In processes of this type, i.e., wherein it is necessary for the fabricator to apply solder to pads, holes and lands on a printed circuit other than by reflow of a tin-lead layer already present thereon by virtue of the particular requirements of a printed circuit fabrication process, a number of solder application possibilities exist, including use of non-electrolytic tin-lead immersion baths into which the printed circuit is immersed (after solder masking of areas not to be plated) to provide a tin-lead coating which can then be reflowed. By far the most prevalent method, however, is by hot air solder levelling, in which the masked printed circuit is immersed in a molten solder and, upon removal, hot air knives then used to blow the solder off all non-adherent surfaces. Hot air solder levelling provides satisfactory solderable pads, holes and lands, for subsequent connections of electronic components thereto via wave soldering, but a number of disadvantages also exist, not the least of which is the severe thermal stress placed on the printed circuit as a consequence of the 200° C.+ molten solder treatment, often leading to pull-away of metal in through-holes and other like problems.

SUMMARY OF THE INVENTION

The primary object of the present invention is to provide a process for rendering selected areas of a printed circuit amenable to the soldering thereat of electronic components.

Another object of the invention is to provide a process for rendering selected areas of a printed circuit amenable to the subsequent soldering thereat of electronic components, which process eliminates the need for the printed circuit fabricator to provide solder on the selected areas.

Yet another more specific object of the invention is to provide a printed circuit, and a process for fabricating a printed circuit, in which through-holes, pads and lands to which electronic components are to be soldered in a subsequent operation, such as by wave soldering, are selectively provided with a non-solder surface which nevertheless renders these areas readily solderable in such subsequent operation.

These and other objects of the invention are attained according to a process wherein the copper surfaces of those through-holes, pads and land areas of a printed circuit to which electronic components are to be soldered, are provided with a coating comprised of a first layer consisting essentially of nickel or consisting essentially of cobalt, followed by a second, over-coating layer consisting essentially of a material which protects the nickel or cobalt coating from oxidation prior to the subsequent solder connection operation, is wettable by solder in the subsequent solder connection operation, and substantially dissolves in the solder in the subsequent solder connection operation without adverse effect on the solder joint between the electronic component and the through-hole, pad or land surface. This material, referred to herein as a protective material, preferably is gold.

The resultant through-hole, pad and land surfaces provided in this manner i.e., consisting of copper, overplated with nickel or cobalt, and then over-plated with protective material, serve as excellent active solderable surfaces for later solder connection thereto of electronic components.

According to the invention, a number of different techniques can be employed for arranging that the through-holes, pads and lands to which solder connections later will be made consist of copper, over-coated with a layer consisting essentially of nickel or of cobalt, and the nickel or cobalt then over-coated with a layer consisting essentially of the protective material. Thus, for example, the printed circuit can be fabricated such that a layer consisting essentially of nickel or cobalt is provided over all copper circuitry surfaces, including traces, through-holes, pads and lands, either electrolytically or non-electrolytically. Thereafter, a solder mask can be applied over those areas, including nickel- or cobalt-coated copper traces, which are not to be involved in subsequent solder connections, and the non-masked areas (i.e., nickel- or cobalt-coated copper through-holes, pads and lands) then selectively provided with an over-coating layer consisting essentially of protective material (which can, if desired, be preceded by further build-up of nickel or cobalt). It will be noted in this regard that since nickel and cobalt are not reflowable under typically-employed subsequent solder connection operations, the provision of solder mask over nickel- or cobalt-coated copper traces does not lead to the bridging and other problems earlier described when solder mask is applied over, e.g., tin-lead coated copper traces.

Alternatively, in an SMOBC-type process, solder mask is applied over those areas, including bare copper traces, which are not to be involved in subsequent solder connections, and the nonmasked areas (i.e., copper through-holes, pads and lands) then selectively coated with a first layer consisting essentially of nickel or cobalt, and a second layer, over the nickel or cobalt, consisting essentially of the protective material, e.g., gold.

This latter SMOBC-type process is somewhat preferred, and in that regard there will be non-electrolytically provided to the non-masked copper through-hole, pad and land surfaces the requisite coating layer of nickel or cobalt and the coating layer of, e.g., gold thereover. Although any non-electrolytic nickel or cobalt depositing bath and process can be employed in this regard, there is obvious preference for baths and techniques which lend themselves to selective plating over just the copper surfaces, i.e., which minimize—and ideally avoid completely—any nickel or cobalt deposition on the solder mask. For this reason, baths and processes which require noble metal catalysis, i.e., the preliminary provision on the copper surfaces to be plated of activating catalytic species such as palladium (from palladium/tin sols or solutions), are not favored since it is difficult to avoid deposition of catalyst, and hence nickel or cobalt plating, on the solder mask. More preferred are use of electroless nickel or cobalt baths which selectively plate copper, and not organic solder mask surfaces, without need for any catalysis (e.g., borane or borohydride-reduced electroless nickel or cobalt baths), or electroless nickel or cobalt baths which can be arranged to selectively plate copper, and not organic solder mask surfaces, by means of particular activation techniques (e.g, hypophosphite-reduced electroless nickel baths using particulate zinc metal as catalyst, as described in commonly-assigned U.S. Pat. No. 5,147,692, and incorporated herein by reference).

According to preferred embodiments of the invention, the outer-facing over-coating layer of protective material, particularly gold, on the selected through-holes, pads and lands to which solder connections later will be made will typically be on the order of from about 0.1 to about 1.0 microns in thickness, and most preferably from about 0.2 to about 0.8 microns in thickness.

The thickness of the coating layer consisting essentially of nickel or cobalt will preferably be on the order of from about 0.1 to about 25 microns, and most preferably from about 1.0 to about 5 microns. This total thickness of the nickel or cobalt layer can be provided entirely by a single form of nickel or cobalt coating, e.g., entirely electrolytic nickel or cobalt in processes lending themselves to electrolytic deposition, or entirely nickel-boron or cobalt-boron (generally containing from about 0.1% up to about 6% by weight boron) deposited from a borane or borohydride-reduced electroless nickel or cobalt bath, or entirely nickel-phosphorous or cobalt-phosphorous (generally having a phosphorous content of from about 1 to about 13% by weight) deposited from a hypophosphite-reduced electroless nickel or cobalt bath. Alternatively, the nickel or cobalt coating can comprise layers of different forms of nickel or cobalt coating. For example, where the nickel or cobalt coating is to be built up electrolessly over copper, it is preferred that the overall thickness be built up from a first thin (strike) coating of nickel-boron or cobalt-boron (say from about 0.1 to about 1.0 microns thick) followed by a second coating to full desired thickness of nickel-phosphorous or cobalt-phosphorous. This mode of application is desirable since no catalytic activation as such is required, i.e., the nickel-boron or cobalt-boron from a borane or borohydride-reduced bath plates on copper per se, and then serves as the active surface for deposition of nickel-phosphorous or cobalt-phosphorous from a hypophosphite-reduced bath, and is also desirable because it minimizes the use of the borane or borohydride reduced baths which are more expensive relative to hypophosphite-reduced depositing baths.

This multiple nickel or cobalt coating technique also can be used to advantage when the nickel or cobalt coating has been selectively applied (typically by electroplating) over all exposed copper circuitry as part of the printed circuit fabrication process, e.g., as an etch-resist, as earlier described. When the patterning resist is removed, copper previously thereunder etched away, and the solder mask selectively applied, the non-masked pad and land areas, consisting of electrolytic nickel or cobalt over copper, will nevertheless have sidewalls where edges of the copper are uncoated by nickel or cobalt. It will often be desired by the customer that those copper edges also be completely amenable to subsequent solder connection operations. Accordingly, it will be preferred in the present invention in such circumstances to selectively electrolessly deposit additional nickel or cobalt at these areas to completely cover the copper edges (incident to this deposition, of course, through-holes also will be given additional nickel or cobalt coating). Indeed, the nickel or cobalt already present on these areas will auto-catalyze deposition even from hypophosphite-reduced nickel or cobalt baths without need for catalysis or special techniques; the nickel or cobalt deposition triggered by the existing nickel or cobalt layer will be found to grow or spread sufficiently to coat the copper edges at the areas in question.

As will be evident, the primary advantage of the invention is that it enables elimination of the need for arranging that solder be present on the surfaces of the printed circuit to which connection of electronic components will be made, instead utilizing the protective material over nickel or cobalt coating to provide a suitably solderable surface for such connections. Since the printed circuit is not subjected to the stress of hot air solder levelling, the physical and electrical integrity of the printed circuit is not compromised and far fewer defective or failed circuits are obtained.

DETAILED DESCRIPTION OF THE INVENTION

As previously noted, the present invention is not critically dependent upon the printed circuit fabrication process per se, so long as the process results in a circuit in which selected through-holes, pads and lands at which connection of electronic components subsequently will be made can be arranged to be built up from copper, an over-coating of nickel or cobalt, and a further over-coating of protective material such as gold.

Figure 1A:
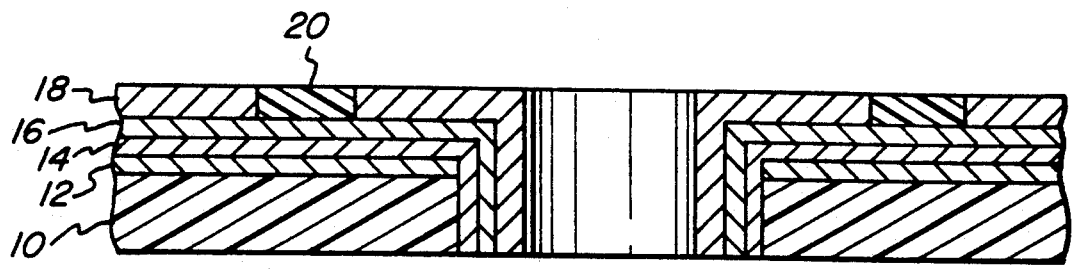
FIGS. 1A–1C show cross-sectional views of a portion of a printed circuit board, including a through-hole and associated surrounding pad, at various processing stages so as to result in a solderable hole surface and pad according to the invention.
Figure 1B:
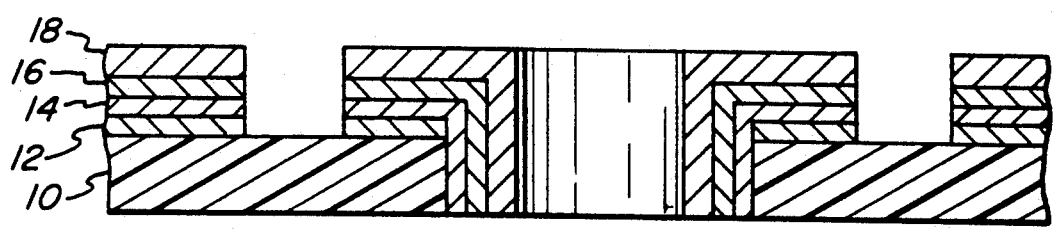
Figure 1C:
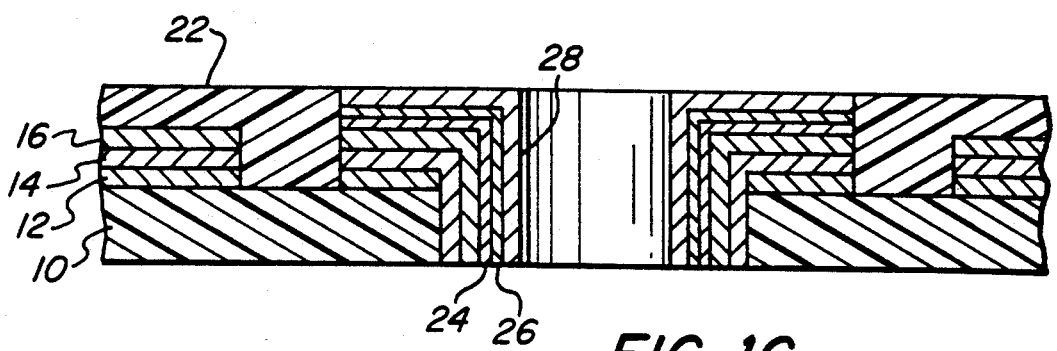

In one typical such generalized process of the subtractive type illustrated in FIGS. 1A–1C a double-sided printed circuit having metallized through-holes is prepared from a suitable thermosetting or thermoplastic dielectric substrate material 10, such as epoxy or polyimide, generally glass-reinforced, and typically having a thin cladding of copper foil 12 on both sides. Through-holes are drilled in the board, and the board then immersed in an electroless copper depositing bath (after suitable activation/catalysis of the board and through-hole surfaces) to metallize the through-hole surfaces, and provide a continuous electroless copper build-up 14 on the board surfaces (on the dielectric per se or over the existing copper foil cladding already on the dielectric, as the case may be). Further copper thickness 16 can be built up electrolytically at this stage, or can await the subsequent patterning steps. In patterning, a negative of the desired circuitry is arranged on the board surfaces using an organic resist 20 (e.g., by application of a layer of photoresist, imagewise exposure, and development), such that subsequent metal plating steps are selective to the areas not covered by the resist.

For process of the SMOBC type, one typical sequence involves application of etch-resistant material 18, such as lead, tin-lead or the like, on the built-up copper surfaces not covered by the patterning resist. Thereafter, the patterning resist 20 is removed and the copper previously under the patterning resist is etched away down to the dielectric subs surface. Thereafter, the etch-resistant material 18 is stripped to expose the bare copper circuitry thereunder, and the board then solder-masked, using an appropriate organic material 22, except at those through-hole, pad or land areas where connections of electronic components will be made by the customer in a subsequent soldering operation (e.g., wave soldering).

There are numerous variations on this SMOBC-type fabrication process which can be practiced, including use of additive processing, fabrication of multilayer circuits, and the like, all as well known in the art.

The solder-masked printed circuit having exposed bare copper through-holes, pads and lands according to any of the foregoing fabrication techniques is then processed to non-electrolytically provide on those exposed bare copper surfaces the requisite protective material over nickel or cobalt coatings according to the invention.

As earlier noted, the preferred means for provision of a nickel or cobalt coating to the exposed copper surfaces in question arrived at by any of the foregoing fabrication sequences involves a first use of a nickel-boron or cobalt-boron electroless plating bath, i.e., an electroless nickel or cobalt plating bath utilizing a borohydride or borane as the reducing agent, since such baths initiate plating on cleaned copper surfaces without need for catalytic activation of the copper surface. Electroless nickel-boron and cobalt-boron baths are well-known in the art, and are available as either alkaline or acid baths. Baths of this type are aqueous solutions containing a nickel or cobalt salt (e.g., chloride, sulfate or the like), complexing agents, pH adjusters, stabilizers, and reducing agents, typically sodium borohydride, n-dimethylamine borane or n-diethylamine borane. For acid baths, the pH generally is from about 4° to about 6.0, and operating temperatures of from about 75 to about 160° F. can be employed, with resultant deposits containing from 0.1 to about 6% by weight boron. For alkaline baths, pH's in excess of 12 typically are employed, and operating temperatures of from about 75° to about 160° F., to produce deposits containing from about 0.1 to 6% boron by weight.

Where the entire nickel or cobalt coating is to be provided by the nickel-boron or cobalt-boron bath, the electroless deposition will continue until a coating thickness of from about 0.1 to about 25 microns is attained, preferably from about 1 to 5 microns. As noted, however, the nickel-boron and cobalt-boron baths are relatively expensive (especially as compared to nickel-phosphorous and cobalt-phosphorous baths) and, thus, a preferred embodiment of the invention involves deposition of only a thin strike layer 24 of nickel-boron or cobalt-boron, on the order of about 0.1 to about 1.0 microns in thickness, which is then followed by a nickel-phosphorous or cobalt-phosphorous coating 26 to full desired thickness.

Nickel-phosphorous and cobalt-phosphorous baths are well-known in the art, and are available in acid and alkaline formulations containing nickel or cobalt salts, complexing agent, pH adjusters, stabilizers and a hypophosphite reducing agent, typically sodium hypophosphite. Acid baths generally have a pH of from about 4 to 7, and operate at temperatures of from about 120° to 220° F., producing deposits having from about 1 to about 13% by weight phosphorous, while alkaline baths generally operate at a pH of 7 to 12 and a temperature of from about 75° to 150° F. Depending upon the thickness of the initially deposited nickel-boron or cobalt-boron coating, the electroless nickel-phosphorous or cobalt-phosphorous coating will be anywhere from about 1 to about 25 microns in thickness.

It is also possible in fabrication sequences of this type to build up the entirety of a nickel layer over the bare copper surfaces from a nickel-phosphorous coating, i.e., without need for an underlying nickel-boron layer. Typically, electroless deposition of nickel-phosphorous from a hypophosphite-reduced bath directly onto copper requires activation of the copper surface with noble metal catalyst, and it is difficult if not impossible to avoid at the same time activation of, and plating on, the solder mask. However, as disclosed in the earlier-mentioned U.S. Pat. No. 5,147,692, selective nickel-phosphorous plating can be achieved through use of particulate zinc metal activation. Thus, for example, the solder-masked circuit having exposed bare copper surfaces to be nickel-phosphorous plated can be contacted with a composition in which particulate zinc metal (on the order of less than 50 microns particle size, more typically from 1 to 20 microns) is suspended in an aqueous carrier (e.g., water) to entrap or attach zinc metal particles onto the copper surfaces, followed by rinsing away of non-adherent zinc. When the board is immersed in the hypophosphite-reduced electroless nickel bath, plating occurs only on the copper surfaces but not the solder-masked surfaces. It is theorized that what occurs is that the zinc on the copper surfaces dissolves in the plating bath in contact with the copper surface, producing a cathodic current, in reference to the copper surface, which promotes nickel deposition thereon from the bath (once a nickel deposit is triggered in this manner, continued electroless deposition of nickel over the deposit occurs autocatalytically). While the same zinc dissolution can occur at solder-masked areas at which zinc particles may have attached or entrapped, the dissolution is unaccompanied by cathodic current, since no copper is there present, and no nickel deposition there occurs. In this manner, then, it is possible to produce the requisite nickel coating on the copper through-hole, pad and land surfaces entirely from a hypophosphite-reduced electroless nickel bath, i.e., to a thickness of anywhere from about 1 to about 25 microns.

Following the nickel or cobalt coating operation, the nickel or cobalt is provided with an overcoating of the protective material 28. For the specific case of the preferred gold coating, the solder-masked printed circuit is immersed in a non-electrolytic gold depositing bath to deposit the requisite, preferably very high purity, gold coating over the nickel or cobalt. Most non-electrolytic gold baths are immersion baths wherein gold is deposited by replacement/exchange reaction with the underlying metal substrate, and are acidic baths (e.g., pH at or near 4.0) typically operated at temperatures of 200° to 215° F. Electroless gold baths also are known by which gold is deposited by reduction of gold salts under influence of a strong reducing agent present in the bath. These baths are typically highly alkaline and also operate at relatively high temperature, e.g., about 190° F. to 200° F.

The gold deposited over the nickel or cobalt copper in this manner preferably will be on the order of from about 0.1 to about 1.0 microns thick, more preferably from about 0.2 to about 0.8 microns thick. The gold coating can, of course, be made up of more than one gold layer, e.g., an immersion gold overplated with electroless gold.

Figure 2A:
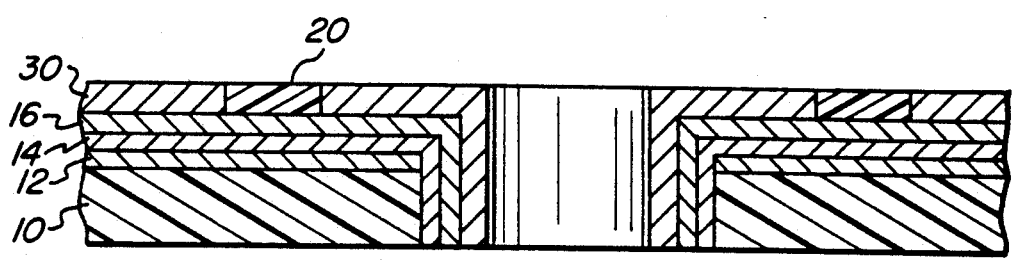
FIGS. 2A and 2B also show cross-sectional views of a portion of a printed circuit board, including a through-hole and associated surrounding pad, at various processing stages, different from those illustrated in FIGS. 1A–1C, so as to arrive at a solderable hole surface and pad according to the invention.
Figure 2B:
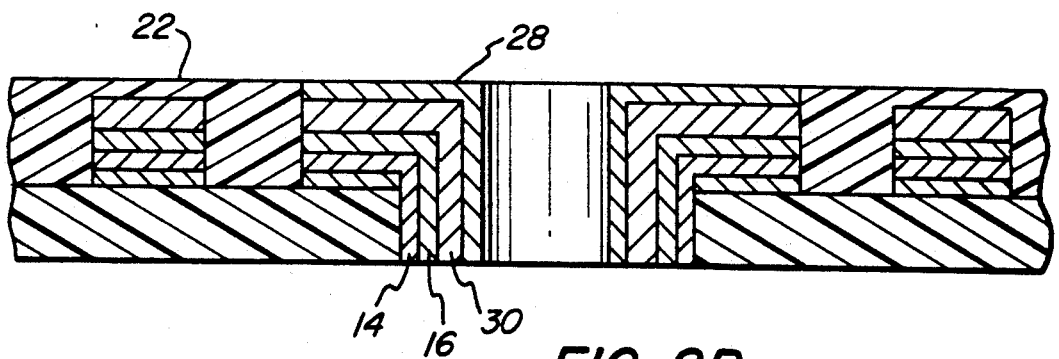

In an alternative, non-SMOBC, processing sequence, illustrated in FIGS. 2A and 2B the requisite protective material over nickel or cobalt coatings for copper through-holes, pads and lands can be arrived at using electrolytic nickel or cobalt plating baths. Thus, for example, the printed circuit can be built up as previously described to arrive at a plating-resist patterned copper circuit. Thereafter, nickel or cobalt can be electrodeposited all exposed copper areas to serve as an etch-resist 30 the copper. The plating resist is then removed, and copper previously under the plating resist is etched away down to the dielectric substrate surface. Solder mask 22 is then applied over those areas, including nickel- or cobalt-coated traces, which will not be involved in subsequent solder connection of electronic components. As previously explained, the non-reflowability of the electroplated nickel or cobalt makes it possible to provide solder mask over the nickel- or cobalt-coated copper traces without concern for the bridging, etc. that can occur under subsequent soldering operations when tin-lead or other reflowable metal is present on the solder-masked traces.

At this stage of the processing, the non-masked nickel-or cobalt-coated through-holes, pads and lands can be processed directly to provide the coating of protective material such as gold 28 over the nickel or cobalt. Alternatively, additional nickel or cobalt can be electrolessly built up before the protective material coating, either to provide additional thickness per se or to insure that exposed copper edges are coated, as earlier described.

It should be understood that in the foregoing description nickel and cobalt are seen to be essentially equivalent in the invention. Thus, although not generally preferred, it is within the contemplation of the invention that the coating over the copper, and under the protective material coating, can be a first layer of nickel and an over-layer of cobalt, or vice-versa.

The invention is further described and illustrated with reference to the following example.

EXAMPLE

A double-sided solder-masked printed circuit having a number of exposed bare copper through-holes and pads was immersed in a cleaner solution (SOAK 028, MacDermid, Inc., Waterbury, Conn.) at 140° F. for one minute, followed by a cold water rinse, immersion in an acid polishing solution {Metex BCB, MacDermid, Inc.) at 85° F. for one minute, cold water rinse, and immersion in an alkaline neutralizer (100 g/l potassium carbonate).

The printed circuit was then immersed in an electroless nickel-boron bath containing dimethylamine borane as the reducing agent (Elnic 7057, MacDermid, Inc.) at 90° F. for one minute, to produce on the exposed copper a nickel-boron strike coating having a thickness of about 4 microinches. Following rinsing, the printed circuit was immersed in an electroless nickel-phosphorous bath containing hypophosphite anion as the reducing agent (Elnic 110) at 185° F. for 20 minutes to produce a nickel-phosphorous coating 0.3 mils thick over the nickel-boron strike. Following rinsing, the printed circuit was immersed in an immersion gold plating bath (ACR 705, American Chemical & Refining Co., Waterbury, Conn.) at 140° F. for 5 minutes to produce over the nickel a gold coating of about 7 to 10 microinches thick.

The so-prepared areas of the printed circuit exhibit excellent solderability in wave soldering connection thereto of electronic chips.

Although the invention has been described with reference to particular preferred embodiments and examples, these are presented in illustration of the invention and its best mode of practice, and are not intended to be limiting of the scope of the invention except as set forth in the appended claims.

What is claimed is:

1. In a printed circuit comprising conductive areas affixed to an insulating substrate, said conductive areas including particular exposed conductive surfaces to which electronic components are to be electrically connected by soldering, the improvement wherein the particular exposed conductive surfaces comprise:
    (a) copper;
    (b) a first coating, over said copper, which consists essentially of (i) a first layer selected from the group consisting of electrolytic nickel, electrolytic cobalt, nickel-boron, and cobalt-boron, and (ii) a second layer, over said first layer, selected from the group consisting of nickel-phosphorus and cobalt-phosphorus; and
    (c) a second coating, over said first coating, which consists essentially of a protective metal, other than solder, which protects the first coating from oxidation, is wettable by solder, and does not adversely affect the solder connection between the particular exposed conductive surfaces and the electronic components electrically connected thereto by soldering.

2. In a printed circuit comprising conductive areas affixed to an insulating substrate, said conductive areas including particular exposed conductive surfaces to which electronic components are to be electrically connected by soldering, the improvement wherein the particular exposed conductive surfaces comprise:
    (a) copper;
    (b) a first coating, over said copper, which consists essentially of (i) a first layer selected from the group consisting of electrolytic nickel, electrolytic cobalt, nickel-boron, and cobalt-boron, and (ii) a second layer, over said first layer, selected from the group consisting of nickel-phosphorus and cobalt-phosphorus; and
    (c) a second coating, over said first coating, which consists essentially of gold.

3. A printed circuit according to claim 2 wherein said particular exposed conductive surfaces are selected from the group consisting of the surfaces of through-holes, surrounding pads, lands, and combinations thereof.

4. A printed circuit according to claim 3 wherein surfaces of said printed circuit other than said particular exposed conductive surfaces are covered by a solder mask.

5. A printed circuit according to any of claims 2, 3 or 4, wherein said first coating consists essentially of a first layer of electrolytic nickel and a second layer of electroless nickel-phosphorus.

6. A printed circuit according to any of claims 1, 2 3 or 4, wherein said first coating consists essentially of a first layer of nickel-boron and a second layer of nickel-phosphorus.

7. A printed circuit according to any of claims 1, 2, 3 or 4 wherein said first coating consists essentially of a first layer, of a thickness of from about 0.1 to about 1.0 microns, of nickel-boron, and a second layer, of a thickness of from about 0.1 to about 25 microns, of nickel-phosphorus.

8. In a process for fabricating a printed circuit having conductive areas affixed to an insulating substrate, and wherein particular ones of said conductive areas include areas having exposed copper surfaces and selected from the group consisting of through-hole surfaces, surrounding pads, lands, and combinations thereof, which are provided in the printed circuit for later connection thereto, by soldering, of electronic components, the improvement comprising:
    (a) applying to said particular exposed copper surfaces a first coating which consists essentially of (i) a first layer selected from the group consisting of electrolytic nickel, electrolytic cobalt, nickel-boron, and cobalt-boron, and (ii) a second layer, over said first layer, selected from the group consisting to nickel-phosphorus and nickel-boron; and
    (b) thereafter applying, over said first coating, a second coating which consists essentially of a protective metal, other than solder, which protects the first coating from oxidation, is wettable by solder, and does not adversely affect the solder connection between the particular exposed copper surfaces and the electronic components connected thereby by soldering.

9. A process according to claim 8 wherein said protective metal consists essentially of gold.

10. A process according to claim 9 further comprising, prior to step (a), the step of applying a solder mask over surface areas of said printed circuit other than said particular exposed copper surfaces.

11. A process according to any of claims 8, 9 or 10 wherein the applying of said first coating comprises non-electronically depositing nickel-boron as said first layer, and thereafter non-electrolytically depositing a second layer, over said first layer, of nickel-phosphorus.

12. A process according to any of claims 8, 9 or 10 wherein the applying of said first coating comprises non-electrolytically depositing a first layer of nickel-boron to a thickness of from about 0.1 to about 1.0 microns, and thereafter non-electrolytically depositing a second layer, over said first layer, of nickel-phosphorus to a thickness of from about 0.1 to about 25 microns.

* * * * *